（12）United States Patent
Kirchhoff et al.

(10) Patent No.: US 6,380,076 B2
(45) Date of Patent: Apr. 30, 2002

(54) DIELECTRIC FILLING OF ELECTRICAL WIRING PLANES

(75) Inventors: Markus Kirchhoff, Ottendorf-Okrilla; Michael Rogalli, Rottenburg; Stephan Wege, Weissig, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/741,308

(22) Filed: Dec. 18, 2000

(30) Foreign Application Priority Data

Dec. 17, 1999 (DE) .......................... 199 61 103

(51) Int. Cl.⁷ .......................... H01L 21/4763
(52) U.S. Cl. .......................... 438/637; 438/623
(58) Field of Search .................. 438/623, 624, 438/629, 634, 637, 638, 690, 734, 738, 740, 625, 627, 678, 687, 688

(56) References Cited

U.S. PATENT DOCUMENTS

| | | | | |
|---|---|---|---|---|
| 5,512,514 A | * | 4/1996 | Lee | 438/624 |
| 5,763,016 A | * | 6/1998 | Levenson et al. | 427/510 |
| 6,010,956 A | * | 1/2000 | Takiguchi et al. | 438/623 |
| 6,117,763 A | * | 9/2000 | May et al. | 438/622 |
| 6,187,668 B1 | * | 2/2001 | Wu et al. | 438/637 |
| 6,235,628 B1 | * | 5/2001 | Wang et al. | 438/638 |
| 6,300,244 B1 | * | 10/2001 | Itabashi et al. | 438/687 |

FOREIGN PATENT DOCUMENTS

| | | | |
|---|---|---|---|
| DE | 27 34 697 C2 | | 2/1978 |
| DE | 38 02 403 A1 | | 8/1989 |
| DE | 793406 A1 | * | 9/1997 |
| DE | 197 44 837 A1 | | 4/1998 |
| EP | 0 177 845 A1 | | 4/1986 |
| EP | 0 680 085 A1 | | 11/1995 |
| JP | 00 051 02 125 A | | 4/1993 |
| JP | 09 167 764 A | | 6/1997 |

* cited by examiner

Primary Examiner—David Nelms
Assistant Examiner—Phuc T. Dang
(74) Attorney, Agent, or Firm—Laurence A. Greenberg; Werner H. Stemer; Gregory L. Mayback

(57) ABSTRACT

The present invention relates to a dielectric filling for electrical wiring planes of an integrated circuit. The electrical wiring of the integrated circuit comprises a base body on which track and passivation planes can already be disposed; a conductive layer which is disposed on the base body and is patterned in such a manner that it exhibits a first conductor track, a second conductor track and a trench between the first conductor track and the second conductor track; at least one dielectric layer is disposed on the conductive layer and at least partially fills the trench, the preferred material of the dielectric layer being the polymer material polybenzoxazole.

15 Claims, 1 Drawing Sheet

DIELECTRIC FILLING OF ELECTRICAL WIRING PLANES

BACKGROUND OF THE INVENTION

FIELD OF THE INVENTION

The present invention relates to the dielectric filling of electrical wiring planes in an integrated circuit.

Integrated circuits consist of a multiplicity of individual patterns which are in most cases arranged in layers on a substrate. Electronic components such as resistors, capacitors, diodes, transistors etc. are usually manufactured in one substrate. The individual components are then electrically interconnected in one or more wiring planes (so-called metalization planes) located thereabove.

A process which is used for the electrical wiring provides for the deposition of a conductive layer on a substrate. The conductive layer is then photolithographically patterned so that conductor tracks with an intermediate trench are produced. The trench is usually filled with a dielectric of silicon oxide. For this purpose, for example, doped silicon oxides such as borosilicate glass, phosphorosilicate glass or arsenosilicate glass or mixtures of these materials are used. The doped silicate glasses have the property of becoming fluid at high temperatures. This makes it possible to fill the trench with an insulating dielectric.

However, the doped silicate glasses have the disadvantage that they exhibit a high dielectric constant of approx. 4. The high dielectric constant has a disadvantageous effect on the speed of signal propagation on the electrical connecting lines which have a high capacitance due to their high dielectric constant. The large capacitance leads to long RC times. The problem of long RC times will become worse in future since, due to the general trend toward ever smaller components, the distances between the individual conductor tracks are continuing to decrease which leads to larger capacitances.

Another problem which accompanies the continuous reduction in size of the electrical circuits is the limited flowability of the doped silicate glasses. As the trenches between the conductor tracks continue to become smaller, this results in voids which are no longer penetrated by the doped silicate glass. The voids have the objectionable characteristic of collecting moisture. During an elevated temperature exposure which the integrated circuit experiences, e.g. when it is soldered on, the integrated circuit explodes due to the vaporization of the collected moisture and, as a result, becomes unusable.

A further disadvantage is the high reflectivity of the doped silicate glass layers which leads to wrong exposures and faulty processing during the subsequent lithographic steps.

SUMMARY OF THE INVENTION

It is accordingly an object of the invention to provide a method of producing dielectric filling of electrical wiring planes and dielectric filled electrical wiring planes, and a dielectric layer for an electrical wiring plane of an integrated circuit, that overcome the above-mentioned disadvantages of the prior art methods and devices of this general type, and exhibits good filling and reflowing characteristics, a low dielectric constant and reflection-suppressing characteristics in photolithographic steps.

With the foregoing and other objects in view there is provided, in accordance with the invention, an electrically wired integrated circuit, comprising:

a base body;

a conductive layer disposed on the base body and patterned such that it exhibits a first conductor track, a second conductor track, and a trench between the first conductor track and the second conductor track, and at least one dielectric layer disposed on the conductive layer and at least partially filling the trench, wherein at least one dielectric layer comprises one or more of the polymer materials polybenzoxazole, polynorbornene, polytetrafluoroethylene and their derivatives.

In addition to or alternatively to polybenzoxazole, other materials are also suitable, which can also be applied to a wafer by spin-on methods. These include inorganic materials such as hydrogen silsesquioxane and organic materials such as polybenzoxazole, polyimide, perylene polymers, polynorbornene and polytetrafluoroethylene and their derivatives and especially their fluorinated derivatives.

With the foregoing and other objects in view there is also provided, in accordance with the invention, a process for producing electrical wiring of an integrated circuit comprising the steps of forming a conductive layer on a base body;

patterning the conductive layer so that a first conductor track, a second conductor track and a trench between the first conductor track and the second conductor track are formed; and spin-coating at least one dielectric layer of a polymer onto the conductive layer so that the trench is at least partially filled. The polymer comprises polybenzoxazole and/or polynorbornene and/or one of their derivatives.

The preferred polymer material polybenzoxazole (PBO) is distinguished by the fact that it can be applied by spin coating and thus fills the smallest gaps without voids. This prevents cavities which can collect moisture in a HAST (humidity acceleration stress test) test and explode during subsequent elevated temperature steps (popcorn effect). Apart from these excellent planarization characteristics, polybenzoxazole, after having been cured, is distinguished by high temperature stability up to above 400° Celsius and low moisture absorption. Moreover, the dielectric constant of polybenzoxazole in its cured state is less than 3.5. The low dielectric constant makes possible faster signals on the integrated circuit due to the lower parasitic capacitances. Furthermore, polybenzoxazole, due to its absorption characteristics, prevents reflections during subsequent photolithographic exposure steps. As a result, a greatly improved resolution is achieved during subsequent photolithographic steps.

In an advantageous development of the integrated circuit according to the invention, a silicon nitride layer is disposed above at least one dielectric layer. The silicon nitride layer has the advantage that it can be used as passivation layer with excellent blocking effect against water vapor, alkali ions and other substances acting corrosively.

In a further advantageous embodiment of the invention, a silicon oxide layer is disposed between at least one dielectric layer and the silicon nitride layer.

In a further advantageous development of the invention, a photosensitive layer of polybenzoxazole or a photosensitive polyamide is disposed above the first dielectric layer.

Other features which are considered as characteristic for the invention are set forth in the appended claims.

Although the invention is illustrated and described herein as embodied in a dielectric filling of electrical wiring planes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

In the figures, identical reference symbols designate identical elements or those having the same function.

DESCRIPTION OF THE PREFERRED EMBODIMENTS

Figure 1:
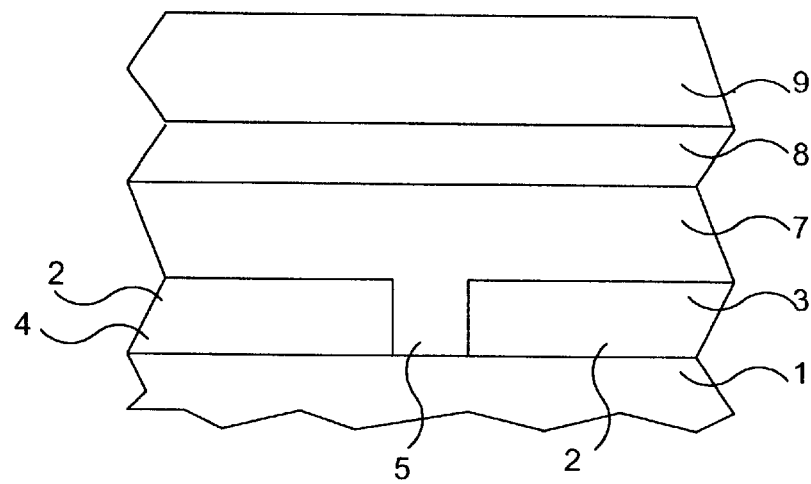
FIG. 1 is a partial sectional view of a layer structure for the electrical wiring according to the prior art.

Referring now to the figures of the drawing in detail and first, particularly, to FIG. 1 thereof, there is seen a prior art layer structure of an electrical wiring. On a base body 1, which can already comprise electronic components such as resistors, capacitors, diodes, transistors, passivation layers etc., a conductive layer 2 is precipitated. The conductive layer 2 is usually formed of a metal such as aluminum or copper. The conductive layer 2 is patterned in such a manner that a first conductor track 3 and a second conductor track 4 with an intermediate trench 5 are produced. After that, a doped silicate glass is usually precipitated and caused to flow by a heating step in such a manner that it fills the trench 5 and forms a silicon oxide layer 7. On the silicon oxide layer 7, a silicon nitride layer 8 is then formed which is used as passivation layer with excellent blocking effect. After that, a photosensitive layer 9 is formed on the silicon nitride layer 8. The photosensitive layer 9 is used as photosensitive layer (photoresist) and consists, for example, of a polyimide, a photosensitive polyimide, a polyimide derivative, a polybenzoxazole, a photosensitive polybenzoxazole or of a polybenzoxazole derivative.

Figure 2:
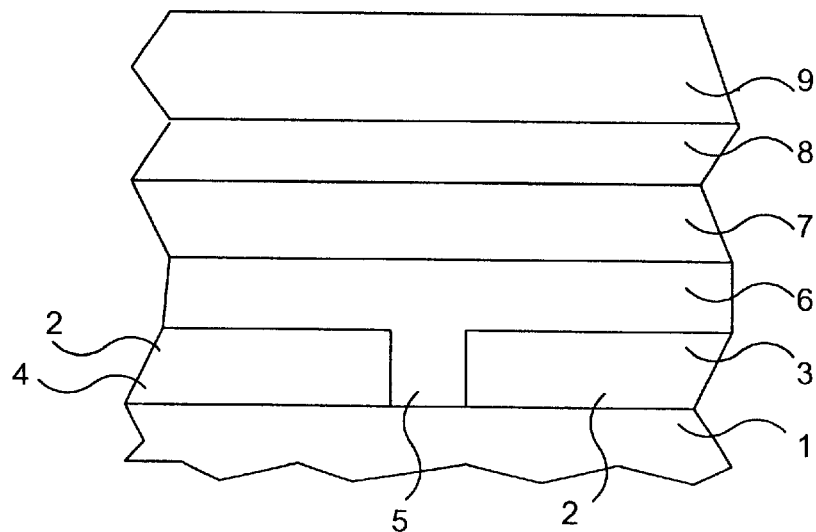
FIG. 2 is a similar view of a layer structure according to the invention.

Referring to FIG. 2, the inventive difference with respect to FIG. 1 concerns a dielectric layer 6 used for filling the trench 5 and for covering the conductive layer 2 and thus for covering the first conductor track 3 and the second conductor track 4. The dielectric layer 6 is, for example, the polymer material polybenzoxazole. The inventive advantage of the first dielectric layer 6 of polybenzoxazole consists in its excellent filling characteristic, its low dielectric constant which is less than 3.5, and the reduction of reflections during subsequent lithographic steps.

Figure 3:
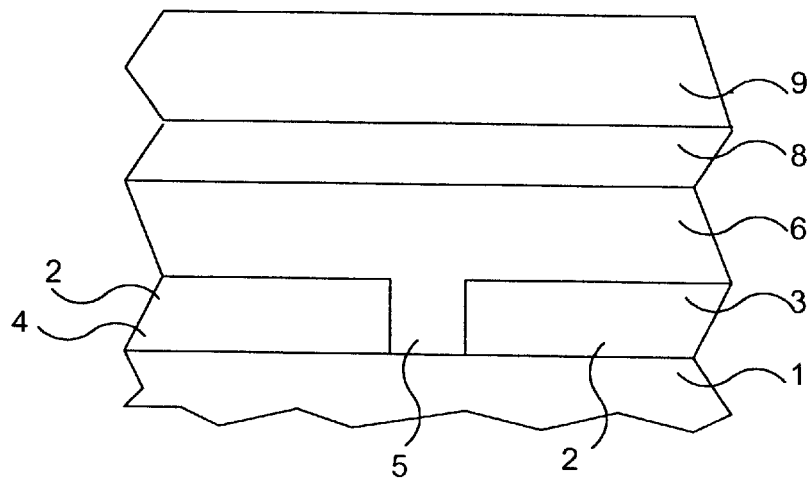
FIG. 3 is a similar view of another layer structure according to the invention.

Referring to FIG. 3, the silicon nitride layer 8 is formed on the dielectric layer 6. In contrast, a silicon oxide layer 7 is first formed on the dielectric layer 6 and the silicon nitride layer 8 is only formed above that in the exemplary embodiment shown in FIG. 2.

Further advantages are provided by the dielectric layer 6 acting as stress reduction layer with respect to the silicon nitride layer 8 which is frequently mechanically stressed, as a result of which integration problems caused by the mechanical stress of the silicon nitride layer are reduced or, respectively, eliminated. Furthermore, the thickness of the dielectric layer 6 in FIG. 3 can be made smaller than the thickness of the silicon oxide layer 7 of FIG. 1, as a result of which subsequent dry etching steps for opening the passivation layer become shorter and are thus performed more economically.

We claim:

1. An electrical wiring of an integrated circuit, comprising:
   a base body;
   a conductive layer disposed on said base body and patterned into a first conductor track, a second conductor track, and a trench between said first conductor track and said second conductor track; and
   a dielectric layer disposed on said conductive layer and at least partially filling said trench, said dielectric layer comprising at least one polymer material selected from the group consisting of polybenzoxazole, polynorbornene, and their derivatives.

2. The electrical wiring according to claim 1, which comprises a silicon nitride layer disposed on said dielectric layer.

3. The electrical wiring according to claim 2, which comprises a silicon oxide layer disposed between said dielectric layer and said silicon nitride layer.

4. The electrical wiring according to claim 1, further comprising a photoactive layer of the same material as said dielectric layer, said photoactive layer disposed above said dielectric layer.

5. The electrical wiring according to claim 1, wherein a material of said first dielectric layer has a dielectric constant of less than 3.5.

6. An electrical wiring of an integrated circuit, comprising:
   a base body;
   a conductive layer disposed on said base body and patterned into a first conductor track, a second conductor track, and a trench between said first conductor track and said second conductor track; and
   a dielectric layer disposed on said conductive layer and at least partially filling said trench, said dielectric layer comprising at least one polymer material selected from the group consisting of fluorinated derivatives of polybenzoxazole, polynorbornene, polyimide, and perylene polymer.

7. A process for producing an electrical wiring of an integrated circuit, which comprises the steps of:
   forming a conductive layer on a base body;
   patterning the conductive layer to form a first conductor track, a second conductor track, and a trench between the first conductor track and the second conductor track; and
   selecting a polymer from the group consisting of polybenzoxazole, polynorbornene, and their derivatives, and spin-coating at least one dielectric layer of the polymer onto the conductive layer so that the trench is at least partially filled.

8. The process according to claim 7, which comprises forming a silicon nitride layer above the dielectric layer.

9. The process according to claim 8, which comprises forming a silicon oxide layer between the dielectric layer and the silicon nitride layer.

10. The process according to claim 7, which further comprises forming a photosensitive layer of the same material as the dielectric layer above the dielectric layer.

11. The electrical wiring according to claim 1, wherein said at least one polymeric material is polybenzoxazole.

12. The electrical wiring according to claim 6, wherein said at least one polymeric material is a fluorinated derivative of polybenzoxazole.

13. The electrical wiring according to claim 1, wherein a material of said dielectric layer has a dielectric constant of less than or equal to 2.9.

14. The process according to claim 7, wherein said at least one polymeric material is polybenzoxazole.

15. The process according to claim 7, wherein said at least one polymeric material is a fluorinated derivative of polybenzoxazole.

* * * * *